US012030772B2

(12) United States Patent
Wang et al.

(10) Patent No.: US 12,030,772 B2
(45) Date of Patent: Jul. 9, 2024

(54) MEMS IMAGE FORMING ELEMENT WITH BUILT-IN VOLTAGE GENERATOR

(71) Applicant: ASML Netherlands B.V., Veldhoven (NL)

(72) Inventors: Yongxin Wang, San Ramon, CA (US); Rui-Ling Lai, San Jose, CA (US); Qian Zhang, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 466 days.

(21) Appl. No.: 16/841,044

(22) Filed: Apr. 6, 2020

(65) Prior Publication Data
US 2020/0317504 A1   Oct. 8, 2020

Related U.S. Application Data
(60) Provisional application No. 62/830,398, filed on Apr. 6, 2019.

(51) Int. Cl.
*B81B 7/00*   (2006.01)
*B81B 3/00*   (2006.01)

(52) U.S. Cl.
CPC ............ *B81B 3/004* (2013.01); *B81B 3/0083* (2013.01); *B81B 7/008* (2013.01); *B81B 2201/047* (2013.01)

(58) Field of Classification Search
CPC ....... B81B 3/004; B81B 3/0083; B81B 7/008; B81B 2201/047; B81B 7/02; B81B 7/007;
(Continued)

(56) References Cited

U.S. PATENT DOCUMENTS

2003/0086147 A1   5/2003   Bruns
2004/0105160 A1   6/2004   Kienzle et al.
(Continued)

FOREIGN PATENT DOCUMENTS

CN   103650097 A   3/2014
CN   108028209 A   5/2018
(Continued)

OTHER PUBLICATIONS

International Search Report and Written Opinion issued in related foreign Application No. PCT/EP2020/058353; dated Aug. 21, 2020 (16 pgs.).
(Continued)

*Primary Examiner* — Alexander A Singh
(74) *Attorney, Agent, or Firm* — Finnegan, Henderson, Farabow, Garrett & Dunner, LLP

(57) ABSTRACT

The present disclosure describes an image forming element having a semiconductor chip with micro-electro-mechanical-system (MEMS) devices and voltage generators, each voltage generator being configured to generate a voltage used by one or more of the MEMS devices. A floating ground may be used to add a voltage to the voltage generated by the voltage generators. The semiconductor chip may include electrical connections, where each voltage generator is configured to provide the voltage to the one or more MEMS devices through the electrical connections. The MEMS devices may define a boundary in the semiconductor chip within which the MEMS devices, the voltage generators, and the electrical connections are located. Each MEMS device may generate an electrostatic field to manipulate an electron beamlet of a multi-beam charged particle microscope. The MEMS devices may be organized into groups based on a distance to a reference location (e.g., optical axis) in the semiconductor chip.

15 Claims, 13 Drawing Sheets

(58) Field of Classification Search
CPC ...... B81B 2201/0292; H01J 2237/1205; H01J 2237/1504; H01J 2237/1516; H01J 2237/1532; H01J 2237/2817; H01J 37/1471; H01J 37/153; H01J 37/12
USPC .......................................... 310/309; 359/290
See application file for complete search history.

(56) References Cited

U.S. PATENT DOCUMENTS

| | | | |
|---|---|---|---|
| 2004/0169147 | A1 | 9/2004 | Ono et al. |
| 2012/0273690 | A1 | 11/2012 | Wieland et al. |
| 2012/0305798 | A1* | 12/2012 | Zonnevylle ......... H01J 37/3174 250/397 |
| 2017/0318385 | A1 | 11/2017 | Harney et al. |
| 2017/0345612 | A1 | 11/2017 | Touya et al. |
| 2020/0317504 | A1* | 10/2020 | Wang ..................... B81B 3/004 |

FOREIGN PATENT DOCUMENTS

| | | |
|---|---|---|
| CN | 109216143 A | 1/2019 |
| CN | 109256313 A | 1/2019 |
| EP | 1389797 A2 | 2/2004 |
| EP | 2879155 A1 | 6/2015 |
| JP | 2004134388 A | 4/2004 |
| JP | 2014519724 A | 8/2014 |
| KR | 2018-0033604 A | 4/2018 |
| TW | 201250757 A1 | 12/2012 |
| TW | 201729233 A | 8/2017 |
| WO | WO 2005/024881 A2 | 3/2005 |
| WO | WO 2006/004374 A1 | 1/2006 |
| WO | WO 2012/062934 A1 | 5/2012 |
| WO | WO 2012/165955 A2 | 12/2012 |
| WO | WO 2013/171117 A1 | 11/2013 |

OTHER PUBLICATIONS

Office Action issued by the Intellectual Property Office (IPO) in related ROC (Taiwan) Patent Application No. 109111509; dated Feb. 5, 2021 (14 pgs.).

Notice of Reasons for Rejection by the Japan Patent Office issued in related Japanese Patent Application No. 2021-558910; dated Oct. 7, 2022 (7 pgs.).

* cited by examiner

MEMS IMAGE FORMING ELEMENT WITH BUILT-IN VOLTAGE GENERATOR

CROSS-REFERENCE TO RELATED APPLICATIONS

This application claims priority of U.S. application 62/830,398 which was filed on Apr. 6, 2019, and which is incorporated herein in its entirety by reference.

FIELD

The present disclosure relates generally to systems that use charged particle microscopes, such as scanning electron microscopes (SEMs), and more particularly, to image forming elements used in such systems.

BACKGROUND

In manufacturing processes used to make integrated circuit (IC) components, unfinished or finished circuit components are inspected to ensure that they are manufactured according to a specified design and are free of defects. Inspection systems utilizing optical microscopes or charged particle (e.g., electron) beam microscopes, such as multi-beam SEMs, can be employed. As the physical sizes of the various features of IC components continue to shrink, the accuracy and throughput achieved by these inspections systems becomes more important. Currently, these systems tend to be at least partially limited by the number of scanning electron beamlets produced by the system for inspection, and by the image forming elements used to manipulate these electron beamlets. Accordingly, improvements in the implementation of image forming elements to enable scaling up of the number of electron beamlets used in multi-beam SEMs is highly desirable.

SUMMARY

The following presents a simplified summary of one or more aspects of various embodiments of the disclosure in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Aspects of an embodiment describe a semiconductor chip having multiple micro-electro-mechanical-system (MEMS) devices and multiple voltage generators, where each of the voltage generators is configured to generate a voltage used by one or more of the MEMS devices (e.g., by a corresponding one of the MEMS devices). The semiconductor chip may also have multiple electrical connections, where each of the voltage generators is configured to provide the voltage to the one or more MEMS devices through one of the electrical connections. Each of the MEMS devices is configured to generate an electric field to manipulate a beamlet of several electron beamlets in a multi-beam charged particle microscope (e.g., scanning electron microscope (SEM), a scanning ion microscope, a transmission electron microscope (TEM), or a scanning proton microscope).

Aspects of another embodiment describe a semiconductor chip having multiple MEMS devices that define a boundary in the semiconductor chip, and multiple voltage generators located within the boundary, where each of the voltage generators is configured to generate a voltage used by one or more of the MEMS devices (e.g., by a corresponding one of the MEMS devices). The semiconductor chip may also have multiple electrical connections located within the boundary, where each of the voltage generators is configured to provide the voltage to the one or more MEMS devices through one of the electrical connections.

Aspects of yet another embodiment describe a semiconductor chip having multiple MEMS devices, where each of the MEMS devices is part of one of multiple groups of MEMS devices, and where each group is based on a distance of the MEMS devices in the group to a reference location in the semiconductor chip. The semiconductor chip may also have multiple voltage generators, where each of the voltage generators is configured to generate a voltage used by one or more of the MEMS devices, and multiple electrical connections, where each of the voltage generators is configured to provide the voltage to the one MEMS device through one of the electrical connections.

Aspects of yet another embodiment describe a semiconductor chip having multiple MEMS devices and multiple voltage generators, where each of the voltage generators is configured to generate a secondary voltage that is added to a primary voltage for that voltage generator, where the primary voltage is provided by a separate voltage generator, and where the added voltages are used by one of the MEMS devices (e.g., by a corresponding one of the MEMS devices). The semiconductor chip may also have multiple electrical connections, where each of the voltage generators is configured to provide the voltage to the one MEMS device through one of the electrical connections.

To accomplish the foregoing and related ends, aspects of embodiments comprise the features hereinafter described and particularly pointed out in the claims. The following description and the annexed drawings set forth in more detail certain illustrative features of the one or more aspects. These features are indicative, however, of but a few of the various ways in which the principles of various aspects may be employed, and this description is intended to include all such aspects and their equivalents.

DETAILED DESCRIPTION

As mentioned above, systems that use optical microscopes or charged particle (e.g., electron) beam microscopes, such as multi-beam SEMs, can be employed for the inspection of finished or unfinished IC components (e.g., semiconductor wafer or die inspection). As the critical dimensions of the IC components continue to shrink, resulting in ever increasing numbers of transistors, and with the overall throughput of the inspection systems also being pushed higher, the accuracy, and speed achieved by these inspections systems becomes more important. One of the key components of these systems is an image forming element used to manipulate (e.g., control the direction of) the electron beamlets aimed at the target being inspected. By using increasing numbers of electron beamlets, it is possible to scan multiple areas of the target (or multiple targets) at the same time and thereby achieve higher throughput. It is therefore desirable to have image forming elements with a scalable architecture that allows for the handling of an increasing number of electron beamlets. This disclosure describes various techniques that enable scalability in an image forming element by implementing a semiconductor chip architecture in which voltage generators are used to drive multiple micro-electro-mechanical-system (MEMS) devices in the image forming element are built locally, that is, right into the image forming element.

Figure 1A:
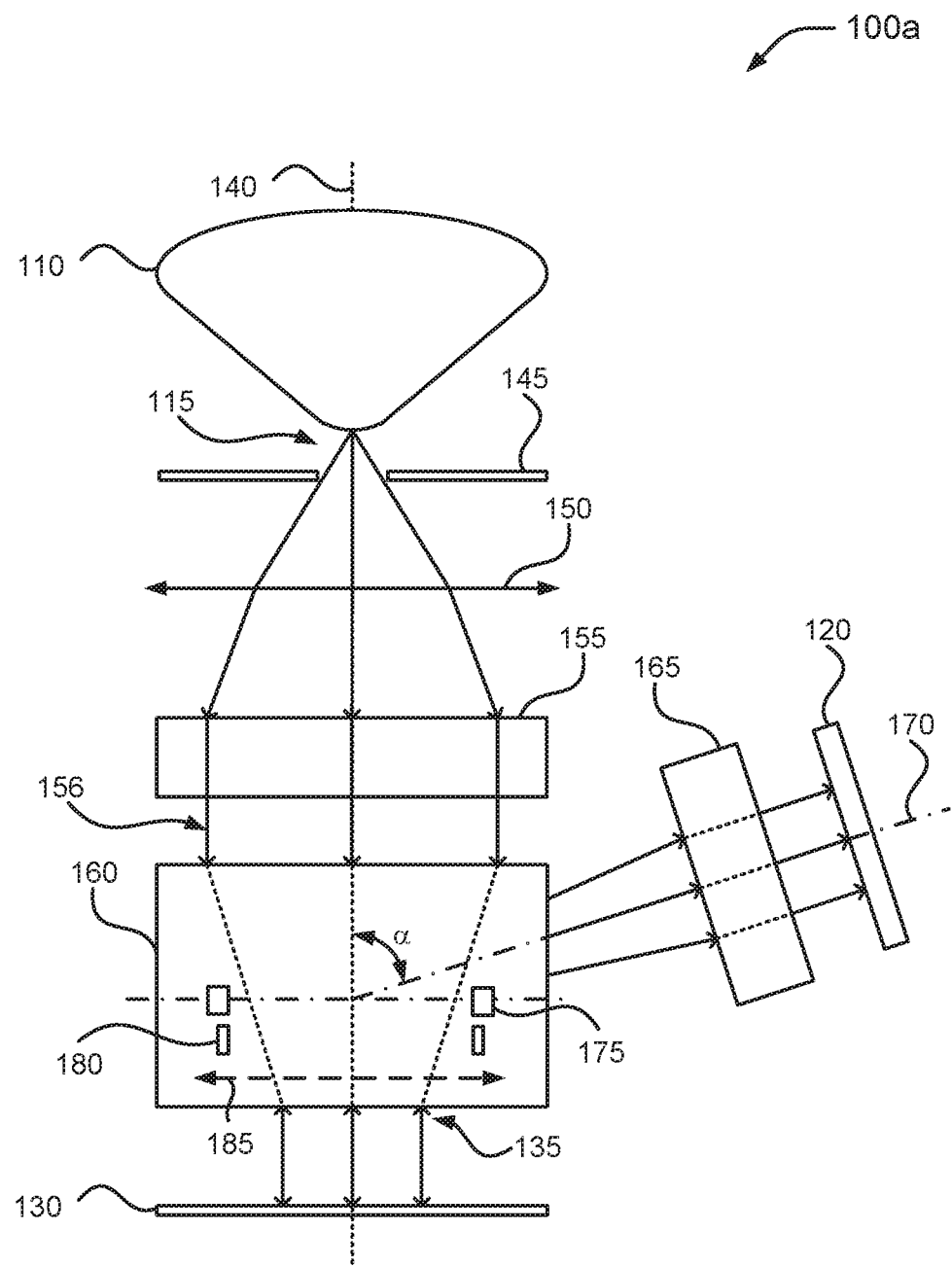
FIG. 1A is a diagram illustrating an SEM.

In multi-beam SEMs, the electron beamlets can be generated by a source conversion unit (see e.g., a source conversion unit 155 in a diagram 100a of FIG. 1A). In the source conversion unit, an image forming element (see e.g., an image forming element 158 in a diagram 100b of FIG. 1B) is used as part of the source conversion unit to generate multiple electron beamlets from a single electron source. In the image forming element, there may be micro lenses, micro deflectors, or stigmators that are used to manipulate the electron beamlets. All of these micro lenses, micro deflectors, or stigmators may be manufactured by a MEMS process on silicon chips (e.g., on semiconductor chips). The number of MEMS structures or devices in the silicon chip typically relates or corresponds to the number of electron beamlets used by the SEM. To operate the source conversion unit in current designs, interconnecting wires are used to connect the various MEMS devices in the image forming element with the voltage generators that provide the operating voltages for those devices. These voltage generators, however, are located outside of the source conversion unit. These interconnecting wires need to be manufactured on the same silicon chips as the MEMS devices and then connected to the outside voltage generators through additional cabling.

As noted above, one way to improve the overall throughput of a multi-beam SEM used in a wafer or semiconductor inspection system is for increasing the number of electron beamlets to further parallelize the inspection process. If the number of electron beamlets is increased, then the numbers of MEMS devices that are needed for the micro lenses, micro deflectors, or stigmators on each silicon or semiconductor chip also need to be increased. This increase in the number of MEMS devices causes a greater density of the MEMS devices (e.g., pitch between MEMS devices gets smaller) and the density of the interconnection wires between the MEMS structures and the outside voltage generators also increases. These issues may make the SEM design, installation, and maintenance unwieldy.

In addition to the density issues caused by an increase in the number of electron beamlets and MEMS devices, another issue that arises is that the voltages that need to be applied to these MEMS devices are already high and may need to be increased even further based on the increase in the number of the MEMS devices. Certain amount of space between any two adjacent interconnecting wires is generally necessary so that there are no electrical breakdowns or high leakage currents and the source conversion unit can operate properly. When the voltages are raised further, then the amount of space between interconnecting wires needs to be enlarged accordingly. This need of additional spacing between interconnecting wires also limits the ability to increase the number and density of the MEMS devices in an image forming element. The huge difficulties that existing designs have to increase the number of MEMS devices in the source conversion unit are clear bottlenecks when one is trying to scale up the throughput of a multi-beam SEM.

The present disclosure describes a new semiconductor chip design or architecture for the image forming elements in the source conversion unit that allows for easier scaling up of the number of MEMS devices. In addition to the MEMS devices (e.g., the micro lenses, the micro deflectors, or the stigmators) and the interconnecting wires, local voltage generators may be embedded, integrated, or built into the semiconductor or silicon chip. Each local voltage generator can provide one or more voltages needed to drive one or more of the micro lenses, the micro deflectors, or the stigmators surrounding it. In this way, the long interconnecting wires that were used to run from the individual MEMS devices to the outside voltage generators in current designs are replaced by short local interconnection wires that now run from the individual MEMS devices to local, built-in voltage generators. This approach largely reduces the areas needed for the interconnecting wires. The only long wires that may still be needed are the shared grounding, the power supply wires, and the wires for additional data communication bus or similar data distribution. To further reduce the number of long wires and the areas needed for the long wires, the wires for data communication bus can also be eliminated by using the power supply wires sending and receiving communication data to and from each local voltage generator. In this way, the issues described above that prevented current designs from scaling up the number of MEMS devices in the source conversion unit no longer exist, and this is achieved without sacrificing any of the flexibility and functionality of the source conversion unit.

The aspects outlined above have the advantage of converting most long interconnecting wires for the MEMS devices in a semiconductor chip (e.g., image forming element silicon chip) in existing designs into short, local interconnecting wires. This reduces the number of interconnections that currently require to go through a vacuum interface or to outside modules, improving the overall SEM design, installation, and maintenance. Moreover, this approach increases the reliability of the source conversion unit and reduces difficulties that would otherwise typically occur during module assembly and system level integration for the source conversion unit, which may even be able to involve automatic assembly by machine. In addition, the voltage or voltages used with each MEMS device may be adjusted independently by having localized voltage generators, again given greater flexibility to account for any local variations in the MEMS devices.

The present disclosure also describes techniques by which on each individual MEMS device layer, such as the layers for the micro lenses, micro deflectors, or stigmators, for example, those MEMS devices that have the same or a substantially similar distance to the grid center (e.g., the optical axis of the image forming element) may be grouped together. In each group, the local voltage generators may generate low level voltages based on a predefined tolerance range and may share a same floating ground. Each floating ground may be offset or biased at a certain voltage (e.g., a primary voltage) by a voltage source or voltage generator (e.g., high voltage power supply) that is located outside the MEMS devices. This offset or biased voltage (e.g., primary voltage) is then added to the voltage provided by the local voltage generators (e.g., a secondary voltage). The voltage generators that provide the offset or biased voltage may be built into the same semiconductor chip as the MEMS devices but away from its respective group of MEMS device, or may be placed outside of the image forming element having the MEMS devices but close to the image forming element.

The built-in voltage generators in each group may be configured to generate low level voltages for the micro lenses, the micro deflectors, or the stigmators. Since the voltage range requirements to these voltage generators are much lower comparing to the voltages applied to the floating ground of most of the groups, the size of the local voltage generators can then be reduced significantly. This means that a higher density of MEMS devices can be achieved in the semiconductor chip since the real estate needed for the local voltage generators is much less than if the grouping approach with floating ground was not used. In this way, further scaling up of the multi-beam SEM is possible by increasing the density of MEMS devices in the image forming elements.

The additional aspects outlined above have the advantage that the size of all local voltage generators may be further reduced without increasing the complexity or affecting the flexibility of the image forming element.

Reference will now be made in detail to example aspects of embodiments, examples of which are illustrated in the accompanying drawings. The following description refers to the accompanying drawings in which the same numbers in different drawings represent the same or similar elements unless otherwise represented. The implementations set forth in the following description of example aspects of embodiments do not represent all implementations consistent with the disclosure. Instead, they are merely examples of structures and processes consistent with aspects of embodiments related to the disclosure as recited in the claims. For example, although some aspects of the disclosure are described in the context of inspection systems that use electron scanning samples and detecting defects, however, these aspects may also be applicable to other types of systems in which multiple charging particle beams are manipulated.

FIG. 1A shows a diagram 100a illustrating a general representation of an SEM that can be part of an inspection system. In this example, the SEM is an off-axis SEM, however some of the features described herein in connection with the image forming element are also applicable to on-axis SEMs. The SEM system includes a source 110 (or similar electron or radiation source), a gun aperture plate 145, a condenser lens 150, a source conversion unit 155, a primary projection system 160, and the target 130, all of which are aligned with the primary axis 140. A beam separator 175 and a deflection scanning unit 180 may be placed inside the primary projection system 160. The primary projection system 160 may also include an objective lens 185. The SEM in the diagram 100a also includes a secondary imaging system 165 that is aligned, along with a detector 120, with a secondary axis 170.

The source 110 may include a cathode, an extractor or an anode, where primary electrons may be emitted from the cathode and extracted or accelerated to form a primary electron beam 115.

The gun aperture plate 145 may be used to block off peripheral electrons of primary electron beam 115 that are not in use to reduce the Coulomb effect, which may enlarge the size of each of the probe spots on the target 130 and therefore deteriorate inspection resolution.

The condenser lens 150 may be used to focus the primary electron beam 115. The electric currents of the electron beamlets downstream of the source conversion unit 155 may be varied by adjusting the focusing power of condenser lens 150 or by changing the radial sizes of the corresponding beam limit apertures within a beam limit aperture array 157 in the source conversion unit 155 (see e.g., the diagram 100b in FIG. 1B).

The source conversion unit 155 may include at least one image forming element 158 (see e.g., the diagram 100b in FIG. 1B) and the beam limit aperture array 157 discussed above. The image forming 158 element may have multiple micro lenses, micro deflectors, or stigmators to form parallel images (virtual or real) with multiple primary electron beamlets 156 from the primary electron beam 115, while the beam limit aperture array 157 may limit the number of electron beamlets 156.

The objective lens 185 in the primary projection system 160 can focus the electron beamlets onto the target 130 for inspection and can form a number of probe spots on the surface of the target 130 based on the number of the primary electron beamlets 156 provided by the source conversion unit 155.

The beam separator 175 in the primary projection system 160 may be a beam separator of Wien filter type generating an electrostatic dipole field and a magnetic dipole field. If they are applied, the force exerted by electrostatic dipole field on the electrons of the primary electron beamlets may be equal in magnitude and opposite in direction to the force exerted on the electrons by the magnetic dipole field, and therefore the electron beamlets may pass straight through the beam separator 175 with zero deflection angles.

The deflection scanning unit 180 in the primary projection system 160 may deflect the primary electron beamlets to scan the probes spots on the surface of the target 130. In response to incidence of the electron beamlets at the probe spots, the secondary electron beamlets 135 may be emitted from the target 130 and having electrons with a distribution of energies including secondary electrons (e.g., energies ≤50 eV) and backscattered electrons (e.g., energies between 50 eV and landing energies of the electron beamlets). The beam separator 175 can direct the secondary electron beamlets towards the secondary imaging system 165, which in turn may focus the secondary electron beamlets onto a surface of the detector 120.

The beam separator 175 may be configured to deflect the secondary electron beamlets 135 by an angle α in the direction of the secondary imaging system 165. An angle α may be determined as the angle between the primary axis 140 and the secondary axis 170, as such, the angle α may represent the separation angle between the on-axis primary electron beam 115 and the secondary electron beamlets 135 that are directed by the beam separator 175 in the direction of the secondary imaging system 165 and the detector 120. In some implementations, the angle α may be set within a range of 5 to 25 degrees. The detector 120 can be a secondary electron (SE) detector that includes a single silicon PIN photodiode array.

Figure 1B:
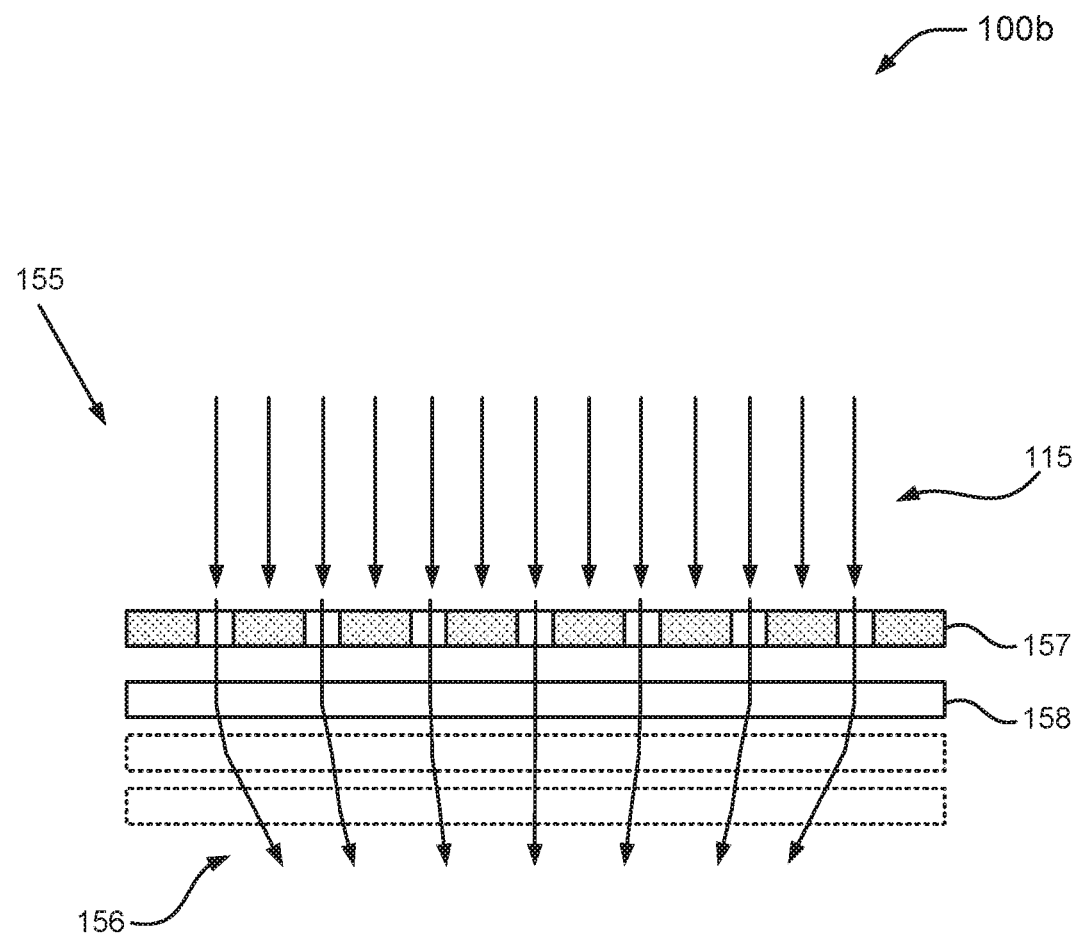
FIG. 1B is a diagram illustrating an image forming element of a source conversion unit used in an SEM.

FIG. 1B shows the diagram 100b illustrating the image forming element 158 of the source conversion unit 155 used in the SEM described above. When multiple electron beams or beamlets are used in an SEM, they may be generated from multiple sources or from a single source. If the electron beams are from multiple sources, multiple columns may scan and focus the electron beams onto the surface of the target, and the signals generated by the electron beams may be detected by detectors in the columns, respectively. An apparatus using beams from multiple sources may be referred to as a multi-column apparatus. If charge particle beams are from a single source, as in the SEM in the diagram 100a in FIG. 1A, a source conversion unit may be used to form multiple virtual or real images of the single beam source. The source conversion unit may have an electrically conductive layer with multiple apertures or opening that divide the charged particles from the single source into multiple electron beamlets. The source conversion unit may have many micro-elements (e.g., MEMS devices), typically organized in an array, that may influence the way of how to manipulate the electron beamlets to form multiple virtual or real images of the single source.

The source conversion unit 155 in the diagram 100a in FIG. 1A is shown in more detail in the diagram 100b in FIG. 1B and includes the beam limit aperture array 157 and the image forming element 158. The beam limit aperture array 157 blocks parts of the primary electron beam 115 to produce the primary electron beamlets 156, which are then manipulated by the image forming element 158. There may be more than one image forming element 158 stacked over each other to produce a combined effect (see dashed blocks representing multiple image forming elements 158). The image forming element 158 may be made using a semiconductor chip. Details of various semiconductor chip designs or architectures that enable the image forming element 150 to handle an increasing number of electron beamlets 156 are provided below in connection with FIGS. 2-7B.

Figure 2:
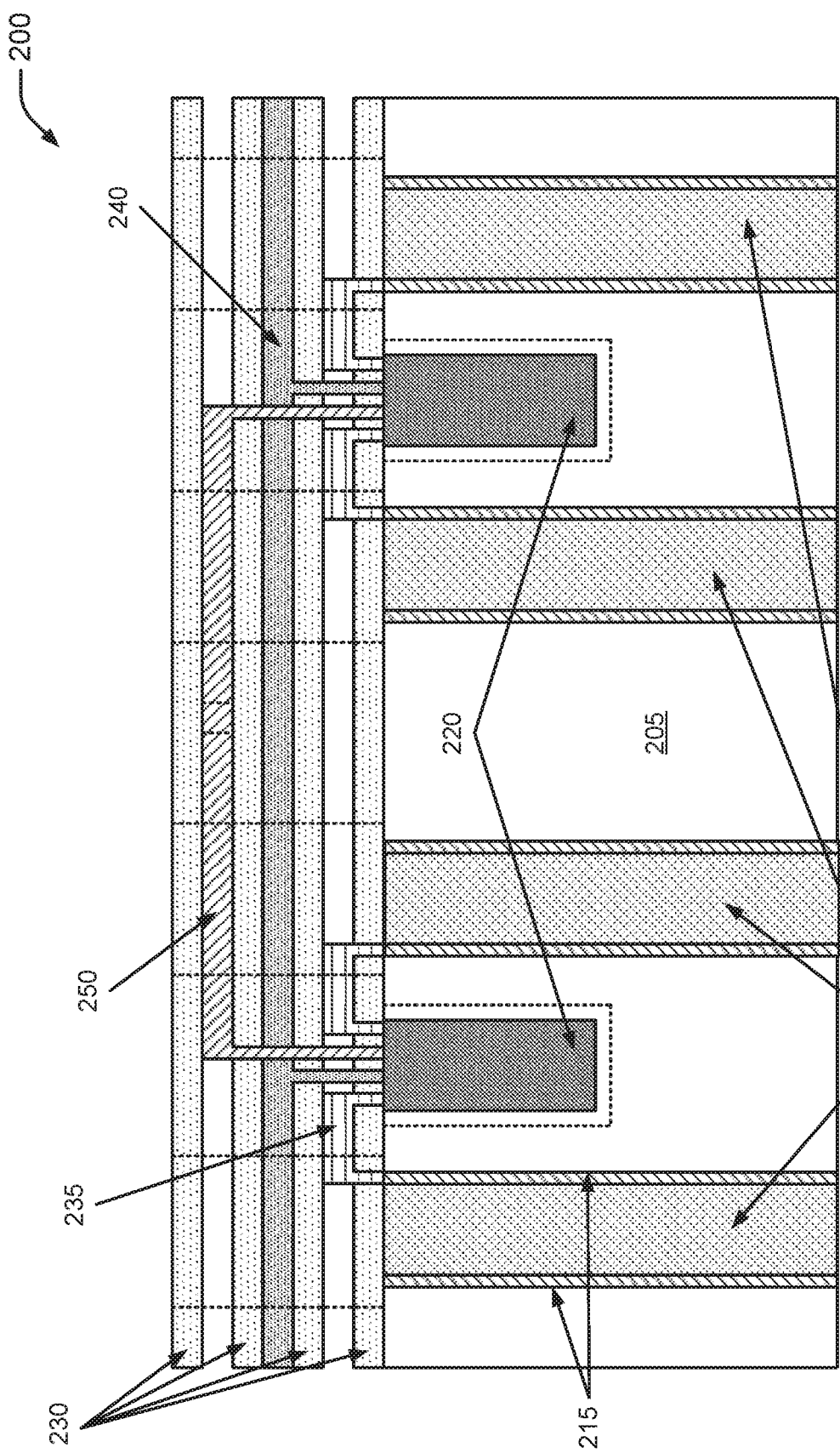
FIG. 2 is a diagram illustrating a cross sectional view of a semiconductor chip with micro-electro-mechanical-system (MEMS) devices and built-in voltage generators, according to some aspects of the present disclosure.

FIG. 2 shows a diagram illustrating a cross sectional view of a semiconductor chip 200 with a base layer 205, MEMS devices 210, and built-in voltage generators 220 (e.g., local voltage generators), according to some aspects of the present disclosure. The semiconductor chip 200 may be part of the image forming element 158 described above in connection with the source conversion unit 155 of a multi-beam SEM. As shown in FIG. 2, base layer 205 includes a surface on which other material or layers may be formed or deposited.

The base layer 205 of semiconductor chip 200 is shown to include multiple MEMS devices 210. Each of the MEMS devices 210 may be a micro lens, a micro deflector, or a stigmator. For example, the semiconductor chip 200 may have an array of MEMS devices 210, all of which may be of the same type (e.g., all micro lenses) or, in some instances, some of which are of one type (e.g., micro lenses) and others are of a different type (e.g., micro deflectors). That is, in the image forming element described above (e.g., the image forming element 158), in each layer, typically the same type of MEMS devices will be formed. The disclosure, however, allows also for the case in which, in the same layer, the types of MEMS devices may be different.

Each of the MEMS devices 210 may include one or more electrostatic elements 215 (e.g., metal elements or metal contacts) configured to receive a voltage from a voltage generator 220 to produce an electrostatic field that manipulates or controls an electron beamlet (e.g., electron beamlets 156). In some cases, such as for micro lenses, the MEMS device 210 may have a single electrostatic element 215, while in other cases, such as for micro deflectors and stigmators, the MEMS device 210 may have multiple electrostatic elements 215.

As shown in FIG. 2, the voltage generators 220 may be embedded, integrated, or assembled into the base layer 205. Each of these voltage generators 220 may consist of one single chip or integrated circuit that includes a local control unit (LCU) of the voltage generator, a digital-to-analog convertors (DAC), and amplifiers or driver circuits to drive surrounding MEMS devices 220. Under some instances, the voltage that is required by the MEMS devices 210 may be quite high. Because of the high voltage requirements, the process for the LCU, DAC, and the driver circuits may not able to be made into a single chip or integrated circuit with the same process node or process techniques, or in order to optimize the performance of each function block in the voltage generator 220, the process used for each of the functions may be different. In those instances, instead of using a single chip or integrated circuit, the voltage generator 220 may be a stack of multiple chips, each of which may achieve one or part of one function of the voltage generator 220.

To provide the appropriate supply voltages and grounding to the voltage generators 220, and ultimately to the MEMS devices 210, a stack or layers are deposited or formed over the base layer 205 as shown in FIG. 2. This stack of layers may include multiple isolation layers 230, metal layers for local voltage distribution 235, metal layers for a ground plane 240, and metal layers for power supply 250. The metal layers for local voltage distribution 235 serve as wires that provide electrical connectivity between the voltage generators 220 and the MEMS devices 210. The metal layers for a ground plane 240 provide one or more ground planes (including floating grounds) that are electrically connected to the voltage generators 220. Although FIG. 2 shows a single ground plane, multiple ground planes may be provided, including multiple floating grounds. The metal layers for power supply 250 provide one or more power supply voltages that are external to the base layer 205 (or in the base layer 205 but external to the array of MEMS devices 210), where these one or more power supply voltages are electrically connected to the voltage generators 220.

The stack of layers shown in semiconductor chip 200 in FIG. 2 is provided by way of illustration and not of limitation. For example, more or fewer layers may be used in the stack of layers and the order of the layers shown may be changed to accommodate a different voltage, ground plane, and interconnect distribution approach.

Moreover, the dashed lines shown through the stack of layers and over the MEMS devices 210 represent apertures or openings in the stack of layers through which the electron beamlets 156 may pass on their way to the MEMS devices 210. Although not shown, the wall of an apertures or openings may have metal coating and may be connected to certain reference voltage or ground to avoid charging effects due to electron or charging particle accumulation. The wall may also be part of the MEMS device or structure, such as part of a micro lens, a micro deflector, or a stigmator.

Figure 3A:
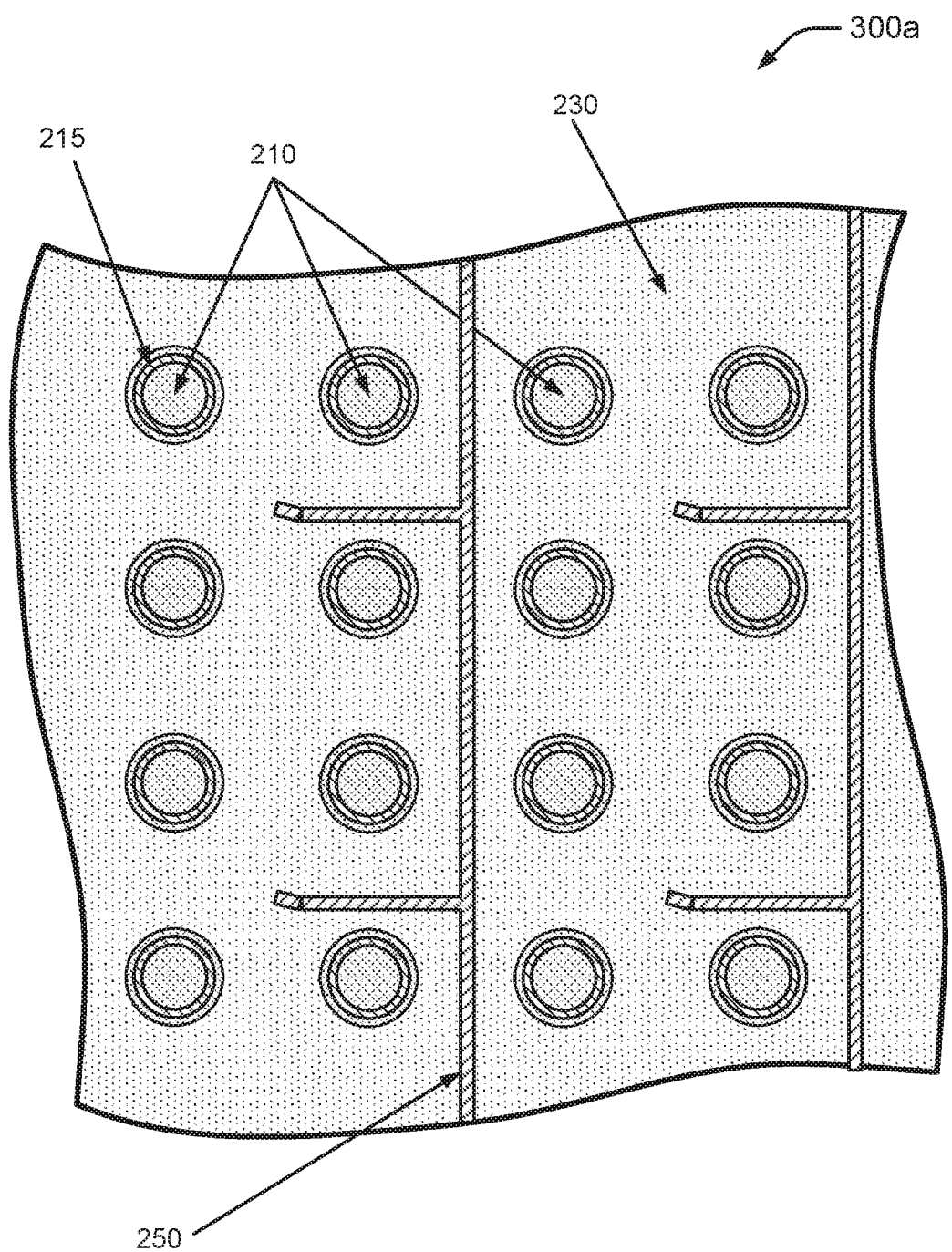
FIGS. 3A-3C are diagrams illustrating different top views of the semiconductor chip in FIG. 2 by removing certain layers and where the MEMS devices are micro lenses, according to some aspects of the present disclosure.
Figure 3B:
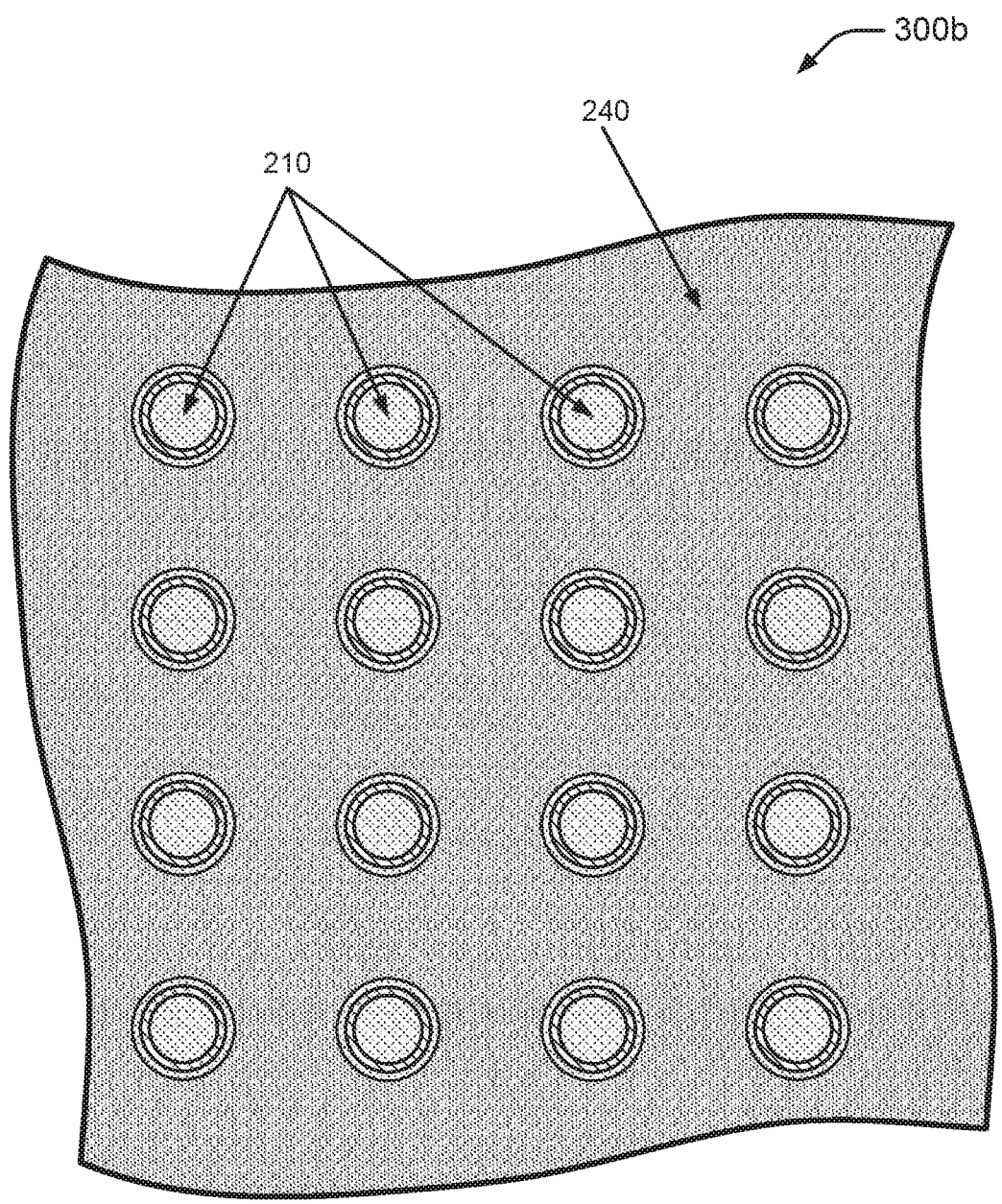
Figure 3C:
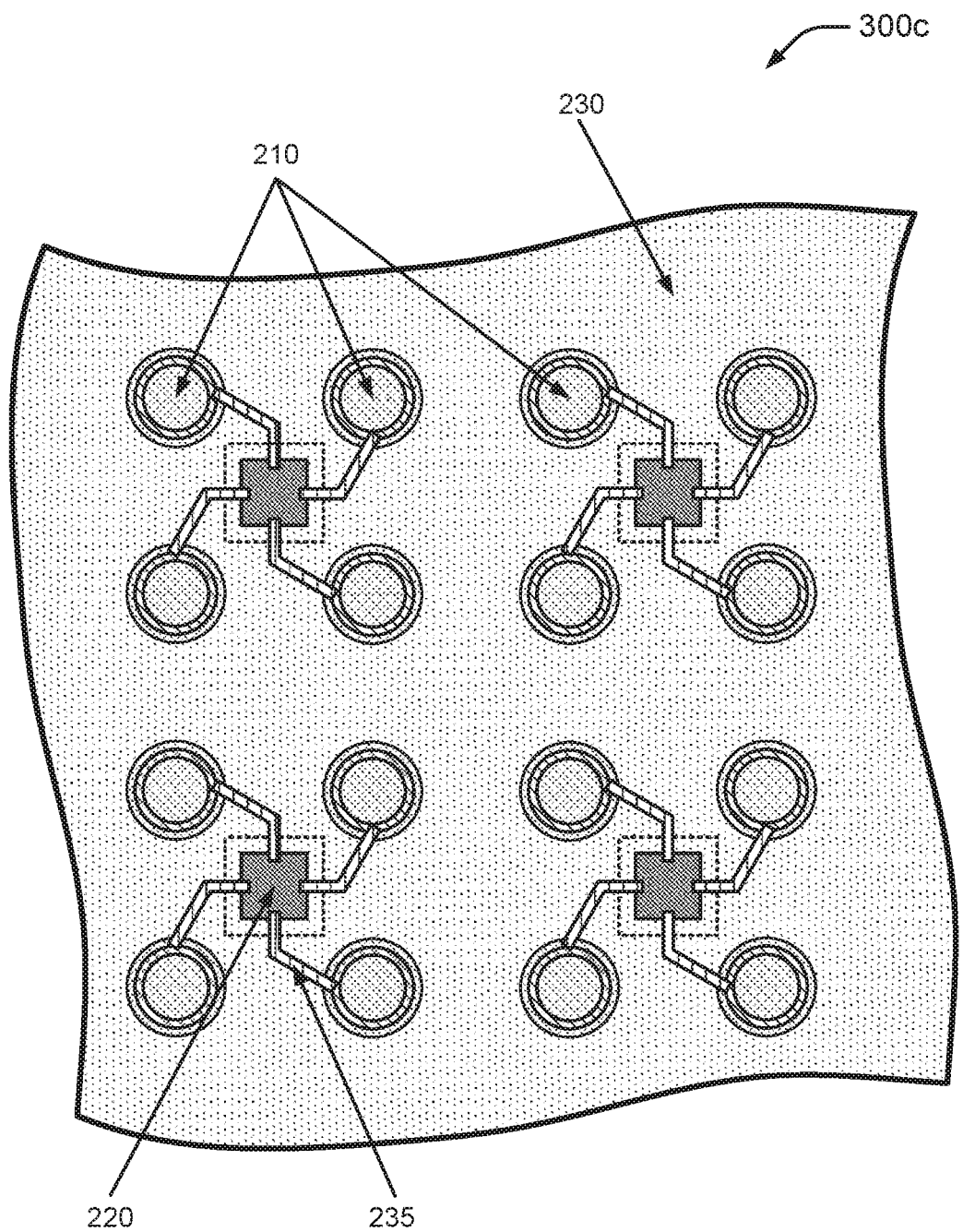

FIGS. 3A-3C show diagrams 300a, 300b, and 300c illustrating different top views of the semiconductor chip 200 in FIG. 2 by removing certain layers and where the MEMS devices 210 are micro lenses. The MEMS devices 210 being micro lenses are shown to have a single electrostatic element 215 formed around the periphery of each MEMS device 210. In the diagram 300a of FIG. 3A, a partial top view of the semiconductor chip 200 is shown with an array of MEMS devices 210 and the metal layers for power supply 250 used to distribute one or more power supply voltages. The metal layers for power supply 250 are placed over an isolation layer 230.

The diagram 300b in FIG. 3B shows a partial top view with the array of MEMS devices 210 and the metal layers for a ground plane 240 with the metal layers for power supply 250 and the isolation layer 230 removed.

The diagram 300c in FIG. 3C shows a partial top view with the array of MEMS devices 210, several voltage generators 220 positioned within subsets of the MEMS devices 210 to supply a voltage to the MEMS devices 210 in the subset, and the metal layers for local voltage distribution 235 (e.g., local electrical connections or wires) used to provide the voltages generated by the voltage generators 220 to the MEMS devices 210. The metal layers for local voltage distribution 235 are laid out over an isolation layer 230.

Figure 4A:
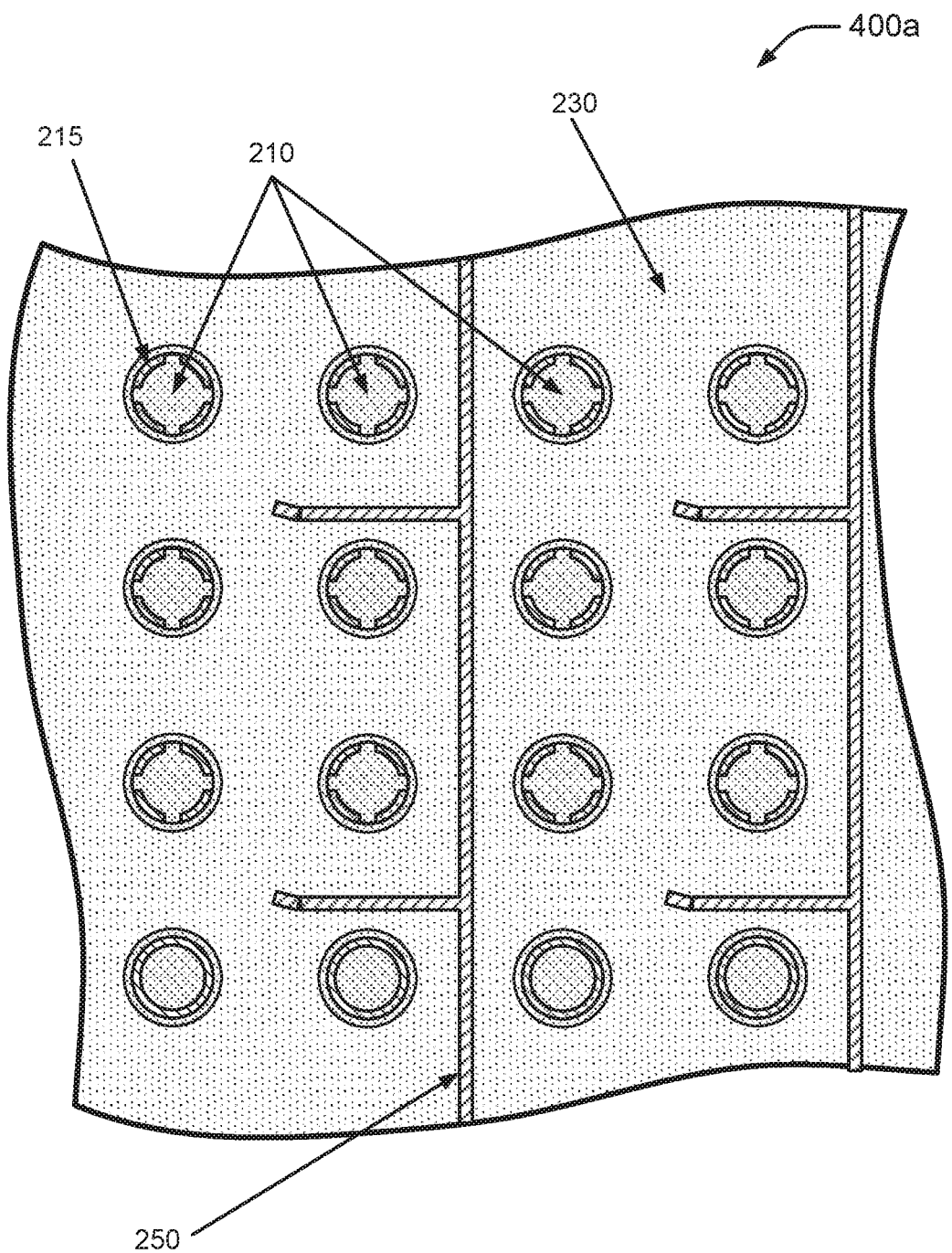
FIGS. 4A-4C are diagrams illustrating different top views of the semiconductor chip in FIG. 2 by removing certain layers and where the MEMS devices are micro deflectors or stigmators, according to some aspects of the present disclosure.
Figure 4B:
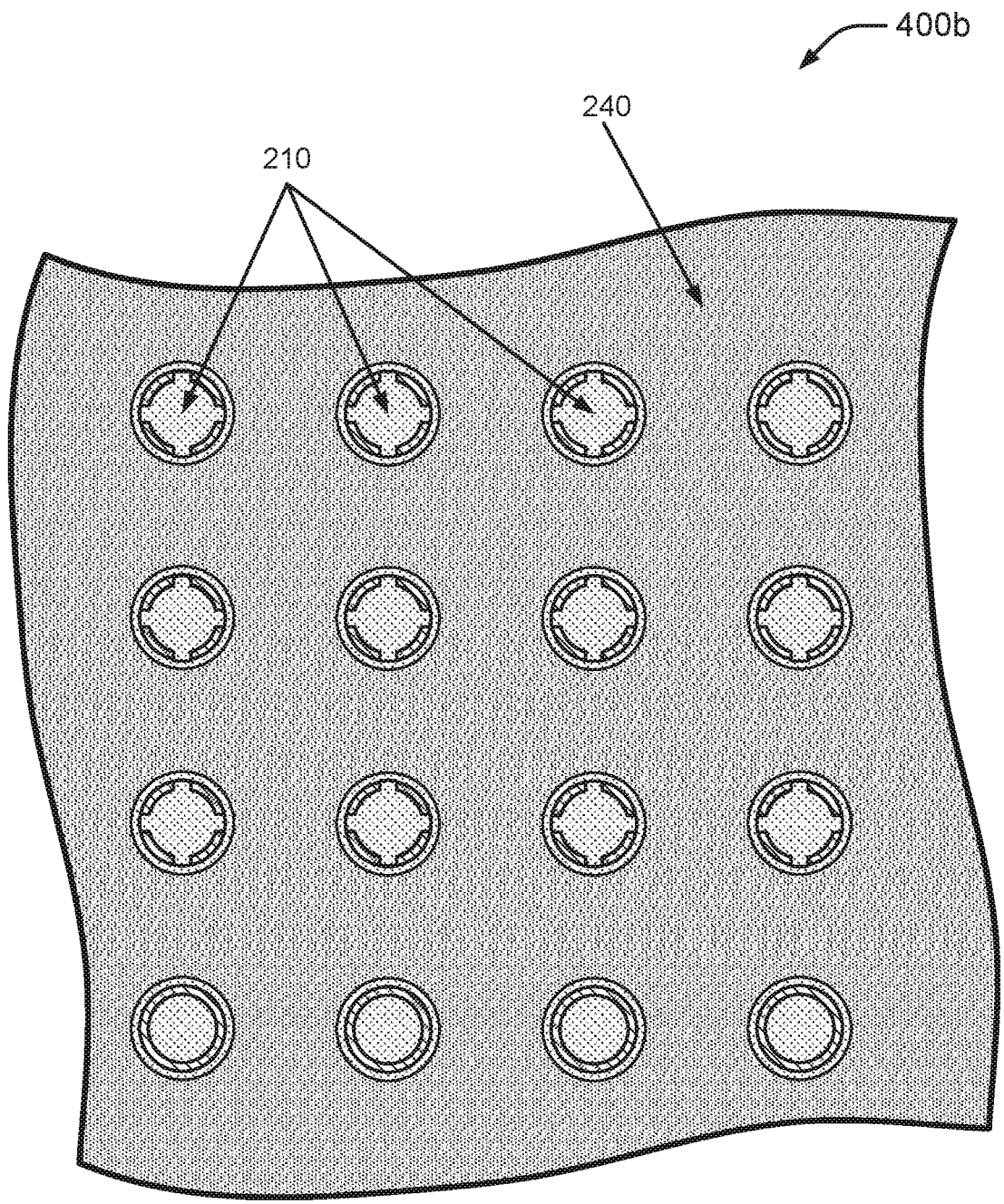
Figure 4C:
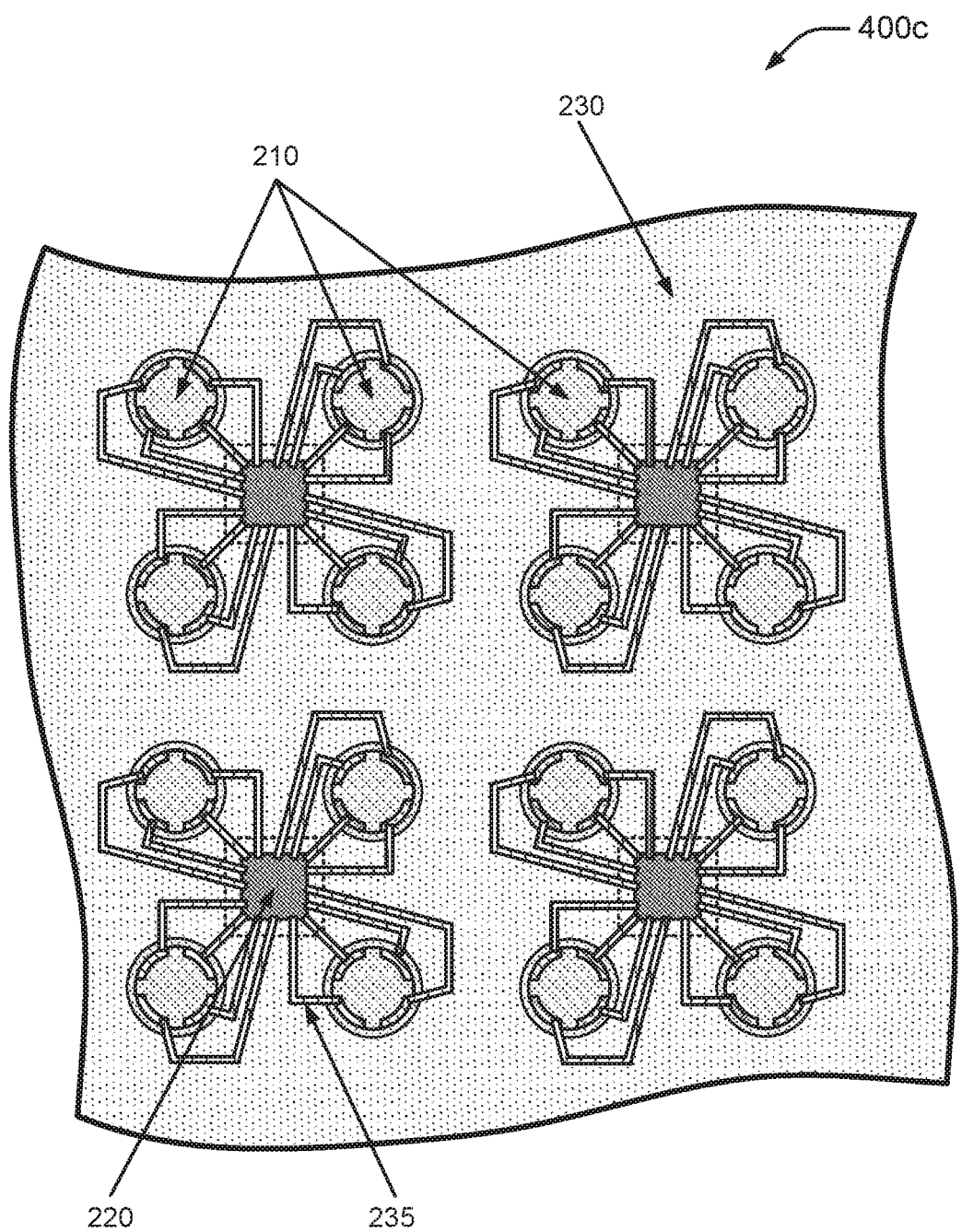

FIGS. 4A-4C show diagrams 400a, 400b, and 400c illustrating different top views of the semiconductor chip 200 in FIG. 2 by removing certain layers and where the MEMS devices 210 are micro deflectors or stigmators, according to some aspects of the present disclosure. The MEMS devices 210 being micro deflectors or stigmators are shown to have more than one electrostatic element 215 formed around the periphery of each MEMS device 210. In the diagram 400a of FIG. 4A, a partial top view of the semiconductor chip 200 is shown with an array of MEMS devices 210 and the metal layers for power supply 250 used to distribute one or more power supply voltages. The metal layers for power supply 250 are laid out over an isolation layer 230.

The diagram 400b in FIG. 4B shows a partial top view with the array of MEMS devices 210 and the metal layers for a ground plane 240 with the metal layers for power supply 250 and the isolation layer 230 removed.

The diagram 400c in FIG. 4C shows a partial top view with the array of MEMS devices 210, several voltage generators 220 positioned within subsets of the MEMS devices 210 to supply a voltage to the MEMS devices 210 in the subset, and the metal layers for local voltage distribution 235 (e.g., local electrical connections or wires) used to provide the voltages generated by the voltage generators 220 to the MEMS devices 210. The metal layers for local voltage distribution 235 are laid out over an isolation layer 230.

In contrast to the diagram 300c in FIG. 3C, where the MEMS devices 210 had a single electrostatic element 215 and only one electrical connection was needed between a MEMS device 210 and a voltage generator 220, in this example each MEMS device 210 has multiple electrostatic elements 215 and therefore multiple electrical connections are needed between a MEMS device 210 and a voltage generator 220.

It is to be understood that the implementations shown in FIGS. 3A-4C are provided by way of illustration and not of limitation. For example, the number of MEMS devices 210 associated with a particular voltage generator 220 may be more or fewer than illustrated in the figures. Although a 2×2 array of MEMS devices 210 is shown associated with each voltage generator 220, the subset may be different, including larger arrays (e.g., 3×3), different types of arrays (e.g., rectangular array instead of square array), or some other arrangement. Moreover, the positioning of the voltage generators 220 need not be as shown but may vary across the semiconductor chip 205. Similarly, the size of the of the voltage generators 220 need not be the same or uniform but may vary across the semiconductor chip 200.

In connection with the FIGS. 3A-4C described above, the present disclosure describes a first embodiment of a semiconductor chip (e.g., the semiconductor chip 200) comprising base layer 205 that includes multiple MEMS devices (e.g., the MEMS devices 210), multiple voltage generators (e.g., the local voltage generators 220), where each of the voltage generators is configured to generate a voltage used by one or more of the MEMS devices (e.g., by a corresponding one of the MEMS devices). The semiconductor chip 200 may be part of an image forming element configured for use in the multi-beam SEM. The semiconductor chip 200 may also include multiple electrical connections (e.g., the metal layers for local voltage distribution 235), where each of the electrical connections includes a plurality of wires, and where each of the voltage generators is configured to provide the voltage to the one MEMS device through one of the electrical connections. In this first embodiment, each of the MEMS devices is configured to generate an electric field to manipulate a beamlet of multiple electron beamlets in a multi-beam charged particle microscope (e.g., a scanning electron microscope (SEM), a scanning ion microscope, a transmission electron microscope (TEM), or a scanning proton microscope).

Each of the MEMS devices may be a micro lens, a micro deflector, or a stigmator, for example. Moreover, the MEMS devices and the voltage generators may be integrated in the semiconductor chip.

In an aspect of this first embodiment of a semiconductor chip, a number of the MEMS devices may be the same or greater than a number of the voltage generators. Alternatively, a number of the MEMS devices may be smaller than a number of the voltage generators.

In another aspect of this first embodiment of a semiconductor chip, the MEMS devices are arranged into subsets, where the voltage generators include one voltage generator for each subset, and where the one voltage generator is configured to generate a voltage (e.g., a separate voltage) for each of the MEMS devices in the respective subset (see e.g., the diagram 300c in FIG. 3C). The one voltage generator may provide the voltage to each of the MEMS devices in the respective subset through a separate one of the electrical connections. Each of the MEMS devices in the respective subset may be a micro lens having a single electrostatic element (e.g., the electrostatic element 215) to which the separate voltage is applied. A number of MEMS devices in each subset may be the same or a number of MEMS devices is different for different subsets. Moreover, the one voltage generator may be located at a center of the MEMS devices in the respective subset (see e.g., the diagram 300c in FIG. 3C).

In another aspect of this first embodiment of a semiconductor chip, the MEMS devices are arranged into a plurality of subsets, where the voltage generators include one voltage generator for each subset, and where the one voltage generator is configured to generate multiple voltages (e.g., separate voltages) for each of the MEMS devices in the respective subset (see e.g., the diagram 400c in FIG. 4C). The one voltage generator may provide the multiple voltages to each of the MEMS devices in the respective subset through multiple ones of the electrical connections. Each of the MEMS devices in the respective subset is a micro deflector or a stigmator having multiple electrostatic elements to which the multiple voltages are respectively applied. A number of MEMS devices in each subset may be the same or a number of MEMS devices is different for different subsets. Moreover, the one voltage generator may be located at a center of the MEMS devices in the respective subset (see e.g., the diagram 400c in FIG. 4C).

In another aspect of this first embodiment of a semiconductor chip, the semiconductor chip may further include a stack of layers disposed over a top surface of the base layer 205 (see e.g., semiconductor chip 200 in FIG. 2), where the stack of layers is configured to provide one or more power supplies or power supply voltages (e.g., the metal layers for power supply 250) to power the voltage generators through one or more power supplies layers and one or more ground planes (e.g., the metal layers for a ground plane 240) connected to the voltage generators through one or more ground planes layers. The stack of layers may include multiple isolation layers (see e.g., the isolation layers 130) to isolate the one or more power supplies layers and the ground plane layers from each other. Each of the voltage generators is electrically connected to the one or more power supplies. As mentioned above, the stack of layers may have openings or apertures, where the wall of the openings or apertures may have metal coating and may be connected to certain reference voltage or ground to avoid charging effects due to electron or charging particle accumulation. The wall may also be part of the MEMS devices such as a micro lens, a micro deflector, or a stigmator. Moreover, each of the electrical connections connects a MEMS device to a respective voltage generator through the stack of layers.

The present disclosure describes a second embodiment of a semiconductor chip (e.g., the semiconductor chip 200) that includes multiple MEMS devices (e.g., the MEMS devices 210) that define a boundary in the base layer 205, and multiple voltage generators (e.g., the local voltage generators 220) within the boundary, where each of the voltage generators is configured to generate a voltage used by one of the MEMS devices. The semiconductor chip 200 may be part of an image forming element configured for being used in a multi-beam charged particle microscope (e.g., an SEM, a scanning ion microscope, a TEM, or a scanning proton microscope).

In one example, the MEMS devices may be arranged in an array and the boundary may be defined as an outer perimeter of the array or as the MEMS devices that form the outer perimeter of the array. The semiconductor chip may also include multiple electrical connections (e.g., the metal layers for local voltage distribution 235) located within the boundary, where each of the electrical connections includes one or more wires (e.g., multiple wires), and where each of the voltage generators provides the voltage to the one MEMS device through one of the electrical connections. Each of the MEMS devices is a micro lens, a micro deflector, or a stigmator. A number of the MEMS devices is the same or greater than a number of the voltage generators, or alternatively, a number of the MEMS devices is smaller than a number of the voltage generators.

In an aspect of this second embodiment of a semiconductor chip, there is also a stack of layers disposed over a top surface of the base layer 205 (e.g., the semiconductor chip 200 in FIG. 2), where the stack of layers is configured to provide one or more power supplies or power supply voltages (e.g., the metal layers for power supply 250) to power the voltage generators through one or more power supplies layers and one or more ground planes (e.g., the metal layers for a ground plane 240) connected to the voltage generators through one or more ground planes layers.

Figure 5:
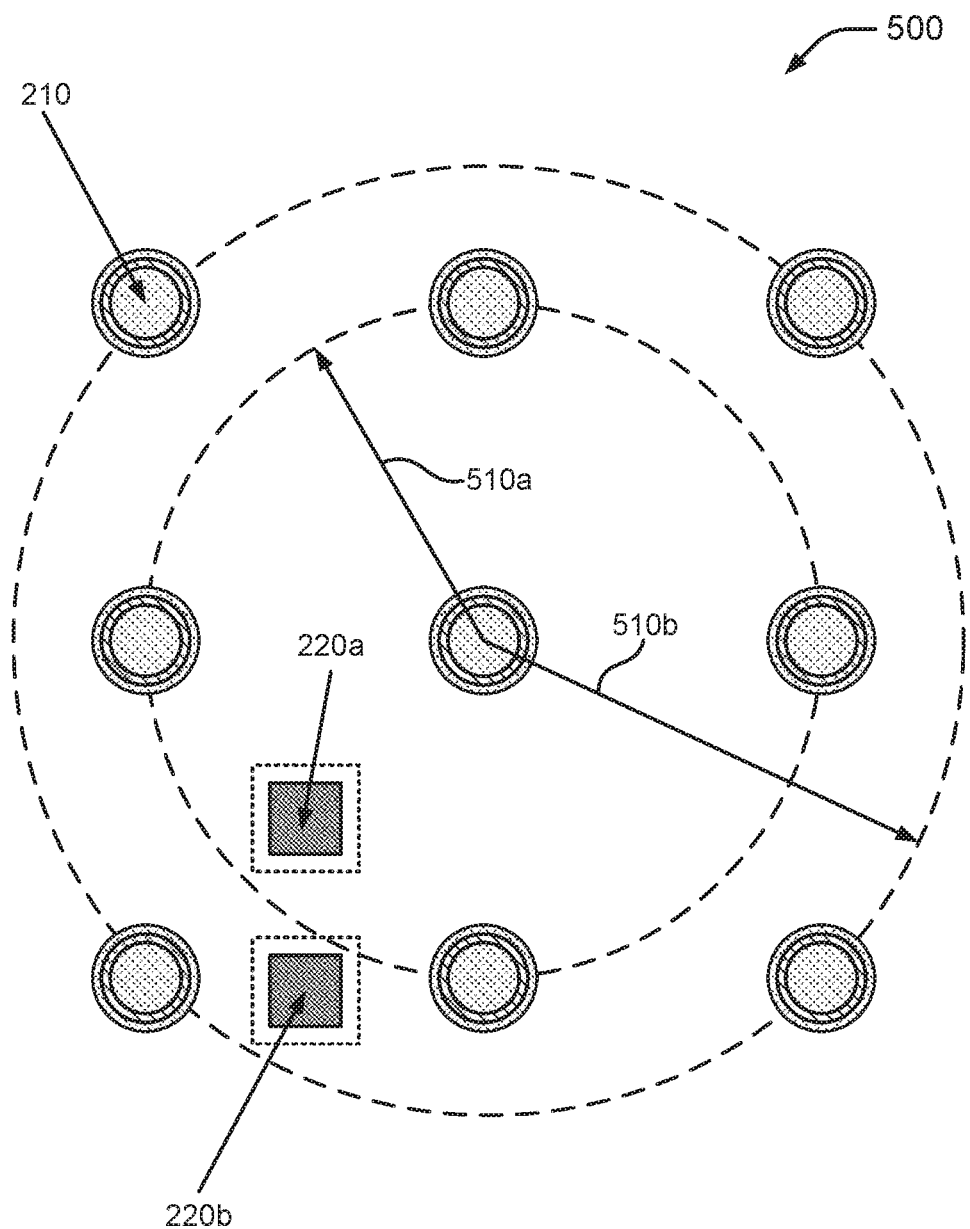
FIG. 5 is a diagram illustrating a partial top view of a semiconductor chip with groups of MEMS devices and built-in voltage generators, according to some aspects of the present disclosure.

FIG. 5 shows a diagram 500 illustrating a partial top view of a semiconductor chip (e.g., the semiconductor chip 200) with MEMS devices 210 arranged into groups and built-in voltage generators 220 (e.g., local voltage generators) for each of the groups, according to some aspects of the present disclosure. Each group may be based on a distance of the MEMS devices 210 in the group to a reference location in the semiconductor chip. In this example there may be shown three groups, a first group that includes the MEMS device 210 in the center part, a second group that includes the MEMS devices 210 in a radius 510a to the center of the semiconductor chip, and a third group that includes the MEMS devices 210 in a radius 510b to the center of the semiconductor chip.

Also shown in the diagram 500 are two voltage generators 220a and 220b for the first group of MEMS devices 210 and for the second group of MEMS devices 210, respectively. Although a single local voltage generator is shown for each group for illustrative purposes, each group may have more than one local voltage generator and these voltage generators need not be of the same size or voltage, and may be positioned in different places (e.g., need not be adjacent to each other).

In connection with the FIGS. 3A-4C and FIG. 5 described above, the present disclosure describes a third embodiment of a semiconductor chip (e.g., the semiconductor chip 200) comprising base layer 205 that includes multiple MEMS devices (e.g., the MEMS devices 210), where each of the MEMS devices is part of one of multiple groups of MEMS devices, and each group is based on a distance of the MEMS devices in the group to a reference location in the semiconductor chip. In one example, the reference location is a center of a grid formed by the MEMS devices. In other examples, the grid formed by an array of the MEMS devices may not have a centrosymmetric shape, and the reference location may be based on an alignment to an optical axis. Moreover, the distance of the MEMS devices in one group to the reference location in the semiconductor chip may be different from the distance of the MEMS devices in another group to reference location in the semiconductor chip. The semiconductor chip may also include multiple voltage generators (e.g., the local voltage generators 220), where each of the voltage generators is configured to generate a voltage used by one of the MEMS devices. The semiconductor chip may be part of an image forming element configured for being used in the multi-beam SEM, and the reference location may coincide or is aligned with an optical axis of the SEM as described above. The semiconductor chip may also include multiple electrical connections (e.g., the metal layers for local voltage distribution 235), where each of the electrical connections includes one or more wires (e.g., multiple wires), and where each of the voltage generators is configured to provide the voltage to the one MEMS device through one of the electrical connections.

In an aspect of this third embodiment of a semiconductor chip, each of the MEMS devices is configured to generate an electric field to manipulate a beamlet of a plurality of electron beamlets in a multi-beam charged particle microscope. Additionally or alternatively, the MEMS devices define a boundary in the semiconductor chip (e.g., by an outer perimeter of an array of the MEMS devices), and the voltage generators and the electrical connections are located within the boundary.

In other aspects of this third embodiment of a semiconductor chip, each of the MEMS devices is a micro lens, a micro deflector, or a stigmator. A number of the MEMS devices is the same or greater than a number of the voltage generators, or alternatively, a number of the MEMS devices is smaller than a number of the voltage generators. Moreover, there may be more than one voltage generator associated with each group of MEMS devices.

Figure 6:
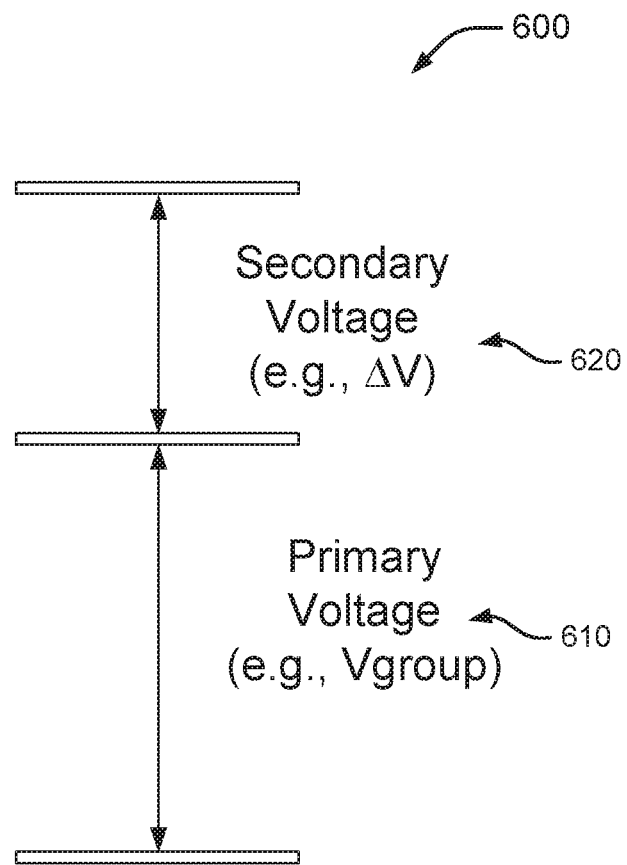
FIG. 6 is a diagram illustrating the use of a primary voltage and a secondary voltage for a semiconductor chip with MEMS devices and built-in voltage generators, according to some aspects of the present disclosure.

FIG. 6 shows a diagram 600 illustrating the use of a primary voltage and a secondary voltage for a semiconductor chip (e.g., the semiconductor chip 200) with MEMS devices (e.g., the MEMS devices 210) and built-in voltage generators (e.g., the local voltage generators 220), according to some aspects of the present disclosure.

As shown in the diagram 600, a voltage applied to one of the MEMS devices 210 (or to one of the electrostatic elements 215 of a MEMS device 210) may result from the addition of a primary voltage 610 produced or provided by a separate (e.g., external) power supply and a secondary voltage 620 produced by a local voltage generator 220. As described above, this may allow to use smaller local voltage generators to alleviate density issues while providing high enough operating voltages. When this approach is applied to the grouping techniques described above in connection with the diagram 500 in FIG. 5, the primary voltage 610 may be provided as an offset or bias voltage (e.g., Vgroup) to a group's floating ground formed by, for example, the metal layers for a ground plane 240, while the secondary voltage (e.g., ΔV) is produced or provided by a local voltage generator 220 associated with the group.

In connection with the FIGS. 3A-5 and FIG. 6 described above, the present disclosure describes a fourth embodiment of a semiconductor chip (e.g., the semiconductor chip 200) comprising base layer 205 that includes multiple MEMS devices (e.g., the MEMS devices 210), and multiple voltage generators (e.g., the local voltage generators 220), where each of the voltage generators is configured to generate a secondary voltage (e.g., the secondary voltage 620) that is added to a primary voltage (e.g., the primary voltage 610) for that voltage generator, where the primary voltage is provided by a separate voltage generator, and where the added voltages are used by one of the MEMS devices.

In an aspect of this fourth embodiment of a semiconductor chip, each of the MEMS devices is part of one of multiple groups of MEMS devices (see e.g., the diagram 500 in FIG. 5), and each group is based on a distance of the MEMS devices in the group to a reference location in the semiconductor chip. The semiconductor chip may include a separate floating ground for each group of MEMS devices, where each group uses the same primary voltage, and the primary voltage is provided through the floating ground for the group (e.g., as an offset or bias voltage applied to the floating ground). The semiconductor chip may have additional electrical connections to connect each of the floating grounds to a respective separate voltage generator. In some instances, the primary voltage applied to one floating ground and the respective group of MEMS devices is different from the primary voltage applied to another floating ground and the respective group of MEMS devices.

In an aspect of this fourth embodiment of a semiconductor chip, each of the MEMS devices in one of the groups is a micro lens, a micro deflector, or a stigmator having multiple electrostatic elements (e.g., the electrostatic elements 215), and one of the voltage generators that is associated with the group generates multiple, separate voltages that are respectively applied to the multiple electrostatic elements of at least one of the MEMS devices in the group. For any one group, the added voltages used by one of the MEMS devices in the group may be different from the added voltages used by another one of the MEMS devices in the group. Moreover, for any one group, the added voltages used by one of the MEMS devices in the group is the same to the added voltages used by another one of the MEMS devices in the group.

Figure 7A:
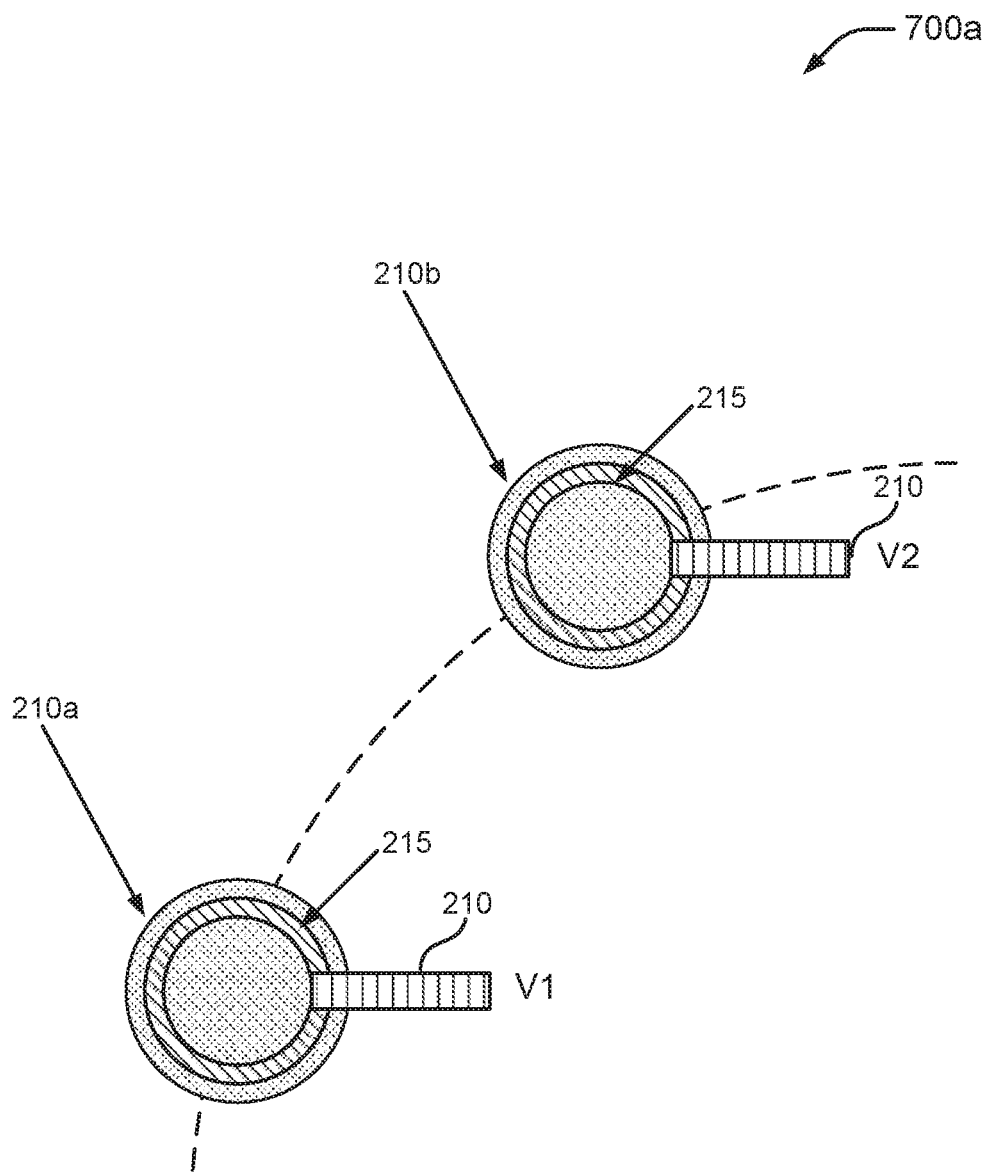
FIGS. 7A and 7B are diagrams illustrating the use of group-level voltages for a semiconductor chip with MEMS devices and built-in voltage generators, according to some aspects of the present disclosure.
Figure 7B:
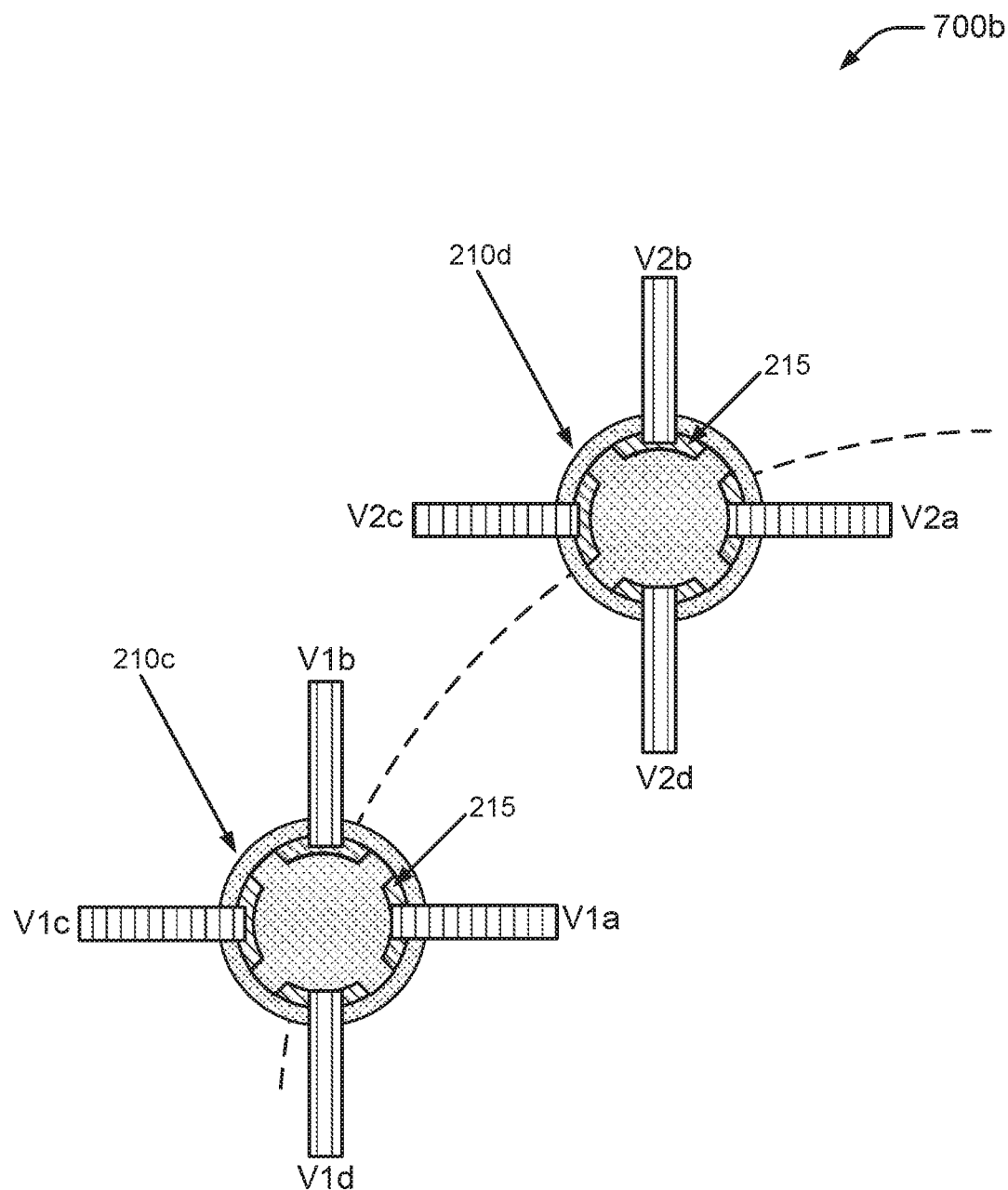

FIGS. 7A and 7B show diagrams 700a and 700b, respectively, further illustrating the use of group-level voltages for a semiconductor chip with MEMS devices and built-in voltage generators, according to some aspects of the present disclosure. For example, the diagram 700a shows two MEMS devices 210a, 210b. In this example, both MEMS devices 210a, 210b are part of a same group (see common circle in dashed line representing a same radius from a reference point). Moreover, both MEMS devices 210a, 210b are micro lenses with a single electrostatic element 215. As described above, for each group there may be one or more local voltage generators 220 (not shown) so it is possible for different MEMS devices in the same group to receive the same or different voltages. In this example, a voltage V1 applied to the MEMS device 210a may be the same or different from a voltage V2 applied to the MEMS device 210b. Although the diagram 700a does not show voltage generators, the group associated with both MEMS devices 210a, 210b may have a single voltage generator 220 that provides the same voltage to both MEMS devices 210a, 210b, a single voltage generator 220 that provides different voltages to both MEMS devices 210a, 210b, two different voltage generators 220—one which provides a voltage to the MEMS device 210a and another that provides the same voltage to the MEMS device 210b, or two different voltage generators 220—one which provides a voltage to the MEMS device 210a and another that provides a different voltage to the MEMS device 210b. In each of these configurations, the voltages applied may be based on a primary voltage provided by a separate voltage generator through a floating ground for the group, and a secondary voltage provided by a local voltage generator 220.

The diagram 700b shows two MEMS devices 210c, 210d. In this example, both MEMS devices 210c, 210d are part of a same group (see common circle in dashed line representing a same radius from a reference point). Moreover, both MEMS devices 210c, 210d are micro deflectors or stigmators with multiple electrostatic elements 215. As described above, for each group there may be one or more local voltage generators 220 (not shown) so it is possible for different MEMS devices in the same group to receive the same or different voltages. In this example, voltages V1a, V1b, V1c, and V1d are applied to the MEMS device 210c may be the same or different from respective voltages V2a, V2b, V2c, and V2d applied to the MEMS device 210d. Although the diagram 700b does not show voltage generators, the group associated with both MEMS devices 210c, 210d may have a single voltage generator 220 that provides the same voltages to both MEMS devices 210c, 210d, a single voltage generator 220 that provides different voltages to both MEMS devices 210c, 210d, or multiple voltage generators 220 to provide the same or different voltages to both MEMS devices 210c, 210d. In each of these configurations, the voltages applied may be based on a primary voltage provided by a separate voltage generator through a floating ground for the group, and a secondary voltage provided by a local voltage generator 220.

The features described above in connection with the diagrams 700a and 700b in FIGS. 7A and 7B, respectively, may be used in conjunction with one or more of the embodiments described above for the semiconductor chip (e.g., the semiconductor chip 200). Moreover, aspects of each of those embodiments may be combined to result in additional embodiments of the semiconductor chip.

The embodiments may further be described using the following clauses:

1. A semiconductor chip, comprising:
   a plurality of micro-electro-mechanical-system (MEMS) devices;
   a plurality of voltage generators, each of the voltage generators configured to generate a voltage used by a corresponding one or more of the MEMS devices; and
   a plurality of electrical connections, each of the voltage generators configured to provide the voltage to the one or more MEMS devices through one or more of the electrical connections,
   wherein each of the MEMS devices is configured to generate an electric field to manipulate an electron beamlet of a plurality of electron beamlets in a multi-beam charged particle microscope.
2. The semiconductor chip of clause 1, wherein the charged particle microscope includes one of a scanning electron microscope (SEM), a scanning ion microscope, a transmission electron microscope (TEM), or a scanning proton microscope.
3. The semiconductor chip of clause 1, wherein each of the MEMS devices is a micro lens, a micro deflector, or a stigmator.
4. The semiconductor chip of clause 1, wherein a number of the MEMS devices is the same or greater than a number of the voltage generators.
5. The semiconductor chip of clause 1, wherein a number of the MEMS devices is smaller than a number of the voltage generators.
6. The semiconductor chip of clause 1, wherein each of the electrical connections includes a plurality of wires.
7. The semiconductor chip of clause 1, wherein the MEMS devices are arranged into a plurality of subsets, the voltage generators include one voltage generator for each subset, and the one voltage generator is configured to generate a voltage for each of the MEMS devices in the respective subset.
8. The semiconductor chip of clause 7, wherein the one voltage generator is configured to provide the voltage to each of the MEMS devices in the respective subset through a separate one of the electrical connections.
9. The semiconductor chip of clause 7, wherein each of the MEMS devices in the respective subset is a micro lens having a single electrostatic element to which the voltage is applied.
10. The semiconductor chip of clause 7, wherein a number of MEMS devices in each subset is the same.
11. The semiconductor chip of clause 7, wherein a number of MEMS devices is different for different subsets.
12. The semiconductor chip of clause 7, wherein the one voltage generator is located at a center of the MEMS devices in the respective subset.
13. The semiconductor chip of clause 1, wherein the MEMS devices are arranged into a plurality of subsets, the voltage generators include one voltage generator for each subset, and the one voltage generator is configured to generate multiple voltages for each of the MEMS devices in the respective subset.
14. The semiconductor chip of clause 13, wherein the one voltage generator is configured to provide the multiple voltages to each of the MEMS devices in the respective subset through multiple, separate ones of the electrical connections.
15. The semiconductor chip of clause 13, wherein each of the MEMS devices in the respective subset is a micro deflector or a stigmator having multiple electrostatic elements to which the multiple voltages are respectively applied.
16. The semiconductor chip of clause 13, wherein a number of MEMS devices in each subset is the same.
17. The semiconductor chip of clause 13, wherein a number of MEMS devices in each subset is different for different subsets.
18. The semiconductor chip of clause 13, wherein the one voltage generator is located at a center of the MEMS devices in the respective subset.
19. The semiconductor chip of clause 1, further comprising a stack of layers disposed over a top surface of the semiconductor chip, the stack of layers being configured to provide one or more power supplies to power the voltage generators through one or more power supplies layers and one or more ground planes connected to the voltage generators through one or more ground planes layers.
20. The semiconductor chip of clause 19, wherein the stack of layers further includes multiple isolation layers to isolate the one or more power supplies layers and the ground planes layers from each other.
21. The semiconductor chip of clause 19, wherein the stack of layers has openings, where a wall of the openings has a metal coating and is connected to a reference voltage or to ground and is configured to avoid or reduce charging effects due to electron or charging particle accumulation.
22. The semiconductor chip of clause 19, wherein each of the voltage generators is connected to the one or more power supplies.
23. The semiconductor of clause 19, wherein each of the voltage generators is connected to the one or more ground planes.
24. The semiconductor chip of clause 19, wherein each of the electrical connections connects a MEMS device to a respective voltage generator through the stack of layers.
25. The semiconductor chip of clause 1, wherein the MEMS devices and the voltage generators are integrated in the semiconductor chip.
26. The semiconductor chip of clause 1, wherein the semiconductor chip is part of an image forming element configured for use in the multi-beam SEM.
27. A semiconductor chip, comprising:
   a plurality of micro-electro-mechanical-system (MEMS) devices that define a boundary in the semiconductor chip;
   a plurality of voltage generators located within the boundary, each of the voltage generators is configured to generate a voltage used by one or more of the MEMS devices; and
   a plurality of electrical connections located within the boundary, each of the voltage generators is configured to provide the voltage to the one or more MEMS devices through one or more of the electrical connections.
28. The semiconductor chip of clause 27, wherein each of the MEMS devices is a micro lens, a micro deflector, or a stigmator.
29. The semiconductor chip of clause 27, wherein a number of the MEMS devices is the same or greater than a number of the voltage generators.

30. The semiconductor chip of clause 27, wherein a number of the MEMS devices is smaller than a number of the voltage generators.
31. The semiconductor chip of clause 27, wherein each of the electrical connections includes a plurality of wires.
32. The semiconductor chip of clause 27, further comprising a stack of layers disposed over a top surface of the semiconductor chip, the stack of layers being configured to provide one or more power supplies to power the voltage generators through one or more power supplies layers and one or more ground planes connected to the voltage generators through one or more ground planes layers.
33. The semiconductor chip of clause 27, wherein the semiconductor chip is part of an image forming element configured for use in a multi-beam charged particle microscope.
34. The semiconductor chip of clause 33, wherein the charged particle microscope includes one of a scanning electron microscope (SEM), a scanning ion microscope, a transmission electron microscope (TEM), or a scanning proton microscope.
35. A semiconductor chip, comprising:
a plurality of micro-electro-mechanical-system (MEMS) devices, each of the MEMS devices is part of one of a plurality of groups of MEMS devices, and each group is based on a distance of the MEMS devices in the group to a reference location in the semiconductor chip;
a plurality of voltage generators, each of the voltage generators is configured to generate a voltage used by one or more of the MEMS devices; and
a plurality of electrical connections, each of the voltage generators is configured to provide the voltage to the one or more MEMS device through one or more of the electrical connections.
36. The semiconductor chip of clause 35, wherein each of the MEMS devices is configured to generate an electric field to manipulate a beamlet of a plurality of electron beamlets in a multi-beam charged particle microscope.
37. The semiconductor chip of clause 36, wherein the charged particle microscope includes one of a scanning electron microscope (SEM), a scanning ion microscope, a transmission electron microscope (TEM), or a scanning proton microscope.
38. The semiconductor chip of clause 35, wherein the MEMS devices define a boundary in the semiconductor chip, and the voltage generators and the electrical connections are located within the boundary.
39. The semiconductor chip of clause 35, wherein each of the MEMS devices is a micro lens, a micro deflector, or a stigmator.
40. The semiconductor chip of clause 35, wherein a number of the MEMS devices is the same or greater than a number of the voltage generators.
41. The semiconductor chip of clause 35, wherein a number of the MEMS devices is smaller than a number of the voltage generators.
42. The semiconductor chip of clause 35, wherein each of the electrical connections includes a plurality of wires.
43. The semiconductor chip of clause 35, wherein the reference location is a aligned with an optical axis of a multi-beam charged particle microscope.
44. The semiconductor chip of clause 43, wherein the semiconductor chip is part of an image forming element configured for use in a multi-beam charged particle microscope, and the center of the grid formed by the MEMS devices is aligned with the optical axis of the multi-beam charged particle microscope.
45. The semiconductor chip of clause 35, wherein the distance of the MEMS devices in one group to the reference location in the semiconductor chip is different from the distance of the MEMS devices in another group to reference location in the semiconductor chip.
46. The semiconductor chip of clause 35, wherein there is one or more voltage generators associated with each group of MEMS devices.
47. A semiconductor chip, comprising:
a plurality of micro-electro-mechanical-system (MEMS) devices;
a plurality of voltage generators, each of the voltage generators is configured to generate a secondary voltage that is added to a primary voltage for that voltage generator, the primary voltage being provided by a separate voltage generator, and the added voltages being used by one or more of the MEMS devices; and
a plurality of electrical connections, each of the voltage generators is configured to provide the voltage to the one MEMS device through one or more of the electrical connections.
48. The semiconductor chip of clause 47, wherein the secondary voltage is smaller than the primary voltage.
49. The semiconductor chip of clause 47, wherein the primary voltage is smaller than the secondary voltage.
50. The semiconductor chip of clause 47, wherein the separate voltage generator is an external voltage generator to the semiconductor chip.
51. The semiconductor chip of clause 47, wherein the separate voltage generator is built into the semiconductor chip.
52. The semiconductor chip of clause 47, wherein each of the MEMS devices is part of one of a plurality of groups of MEMS devices, and each group is based on a distance of the MEMS devices in the group to a reference location in the semiconductor chip.
53. The semiconductor chip of clause 52, further comprising a separate floating ground for each group of MEMS devices, each group using the same primary voltage, and the primary voltage being provided through the floating ground for the group.
54. The semiconductor chip of clause 53, further comprising additional electrical connections to connect each of the floating grounds to a respective separate voltage generator.
55. The semiconductor chip of clause 53, wherein the primary voltage applied to one floating ground and the respective group of MEMS devices is different from the primary voltage applied to another floating ground and the respective group of MEMS devices.
56. The semiconductor chip of clause 52, each of the MEMS devices in one of the groups is a micro lens, a micro deflector, or a stigmator having multiple electrostatic elements, and one of the voltage generators that is associated with the group generates multiple voltages that are respectively applied to the multiple electrostatic elements of at least one of the MEMS devices in the group.
57. The semiconductor chip of clause 52, wherein for any one group, the added voltages used by one of the MEMS devices in the group is different from the added voltages used by another one of the MEMS devices in the group.
58. The semiconductor chip of clause 52, wherein for any one group, the added voltages used by one of the MEMS devices in the group is the same to the added voltages used by another one of the MEMS devices in the group.

This disclosure, which includes FIGS. 1A-7B and their respective descriptions, provides various techniques that improve the scalability of the number of electron beamlets used in SEM systems. For example, this disclosure describes the use of built-in local voltage generators that reduce the need for cumbersome connections and allow for higher densities of MEMS devices in an image forming element. Moreover, the use of floating grounds for different groups of MEMS devices enables smaller local voltage generators, further enabling higher density of MEMS devices in an image forming element, and thus a greater number of electron beamlets for improved inspection throughput.

It is to be understood that the described embodiments are not mutually exclusive, and elements, components, materials, or steps described in connection with one example embodiment may be combined with, or eliminated from, other embodiments in suitable ways to accomplish desired design objectives.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Additionally, the articles "a" and "an" as used in this application and the appended claims should generally be construed to mean "one or more" unless specified otherwise or clear from context to be directed to a singular form.

The use of figure numbers or figure reference labels in the claims is intended to facilitate the interpretation of the claims. Such use is not to be construed as necessarily limiting the scope of those claims to the embodiments or implementations shown in the corresponding figures.

It will be further understood that various changes in the details, materials, and arrangements of the parts which have been described and illustrated in order to explain the nature of described aspects or embodiments may be made by those skilled in the art without departing from the scope as expressed in the following claims.

The invention claimed is:

1. A semiconductor chip, comprising:
a base layer, comprising:
   a plurality of micro-electro-mechanical-system (MEMS) devices formed in the base layer; and
   a plurality of voltage generators formed in the base layer, each of the voltage generators configured to generate a voltage used by a corresponding one or more of the MEMS devices; and
a plurality of electrical connections formed above the base layer, each of the voltage generators configured to provide the voltage to the one or more MEMS devices through one or more of the electrical connections, wherein each of the MEMS devices is configured to generate an electric field to manipulate an electron beamlet of a plurality of electron beamlets in a multi-beam charged particle microscope.

2. The semiconductor chip of claim 1, wherein the charged particle microscope includes one of a scanning electron microscope (SEM), a scanning ion microscope, a transmission electron microscope (TEM), or a scanning proton microscope.

3. The semiconductor chip of claim 1, wherein each of the MEMS devices is a micro lens, a micro deflector, or a stigmator.

4. The semiconductor chip of claim 1, wherein a number of the MEMS devices is the same or greater than a number of the voltage generators.

5. The semiconductor chip of claim 1, wherein a number of the MEMS devices is smaller than a number of the voltage generators.

6. The semiconductor chip of claim 1, wherein each of the electrical connections includes a plurality of wires.

7. The semiconductor chip of claim 1, wherein the MEMS devices are arranged into a plurality of subsets, the voltage generators include one voltage generator for each subset, and the one voltage generator is configured to generate a voltage for each of the MEMS devices in the respective subset.

8. The semiconductor chip of claim 7, wherein the one voltage generator is configured to provide the voltage to each of the MEMS devices in the respective subset through a separate one of the electrical connections.

9. The semiconductor chip of claim 7, wherein each of the MEMS devices in the respective subset is a micro lens having a single electrostatic element to which the voltage is applied.

10. The semiconductor chip of claim 7, wherein a number of MEMS devices in each subset is the same.

11. The semiconductor chip of claim 7, wherein a number of MEMS devices is different for different subsets.

12. The semiconductor chip of claim 7, wherein the one voltage generator is located at a center of the MEMS devices in the respective subset.

13. The semiconductor chip of claim 1, wherein the MEMS devices are arranged into a plurality of subsets, the voltage generators include one voltage generator for each subset, and the one voltage generator is configured to generate multiple voltages for each of the MEMS devices in the respective subset.

14. The semiconductor chip of claim 13, wherein the one voltage generator is configured to provide the multiple voltages to each of the MEMS devices in the respective subset through multiple, separate ones of the electrical connections.

15. The semiconductor chip of claim 13, wherein each of the MEMS devices in the respective subset is a micro deflector or a stigmator having multiple electrostatic elements to which the multiple voltages are respectively applied.

* * * * *